United States Patent
Saito et al.

(10) Patent No.: US 10,468,430 B2
(45) Date of Patent: Nov. 5, 2019

(54) SEMICONDUCTOR STORAGE DEVICE

(71) Applicant: TOSHIBA MEMORY CORPORATION, Minato-ku (JP)

(72) Inventors: Shinji Saito, Yokohama (JP); Toshifumi Minami, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 52 days.

(21) Appl. No.: 15/455,644

(22) Filed: Mar. 10, 2017

(65) Prior Publication Data

US 2017/0263639 A1   Sep. 14, 2017

(30) Foreign Application Priority Data

Mar. 11, 2016   (JP) ................................ 2016-048690

(51) Int. Cl.

| | | |
|---|---|---|
| H01L 27/11582 | (2017.01) | |
| G11C 16/04 | (2006.01) | |
| G11C 16/08 | (2006.01) | |
| G11C 16/26 | (2006.01) | |
| H01L 27/1157 | (2017.01) | |
| H01L 27/11573 | (2017.01) | |
| H01L 27/11565 | (2017.01) | |
| H01L 27/11575 | (2017.01) | |

(52) U.S. Cl.
CPC .... *H01L 27/11582* (2013.01); *G11C 16/0483* (2013.01); *G11C 16/08* (2013.01); *G11C 16/26* (2013.01); *H01L 27/1157* (2013.01); *H01L 27/11565* (2013.01); *H01L 27/11573* (2013.01); *H01L 27/11575* (2013.01)

(58) Field of Classification Search
CPC ........... H01L 27/11582; H01L 27/1157; H01L 27/11573; G11C 16/0483; G11C 16/08
See application file for complete search history.

(56) References Cited

U.S. PATENT DOCUMENTS

| | | | |
|---|---|---|---|
| 2007/0252201 A1* | 11/2007 | Kito | H01L 21/8221 257/331 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2011/0284946 A1 | 11/2011 | Kiyotoshi | |

FOREIGN PATENT DOCUMENTS

JP    2007-266143    10/2007

* cited by examiner

*Primary Examiner* — Jay C Chang
*Assistant Examiner* — Mikka Liu
(74) *Attorney, Agent, or Firm* — Oblon, McClelland, Maier & Neudstadt, L.L.P.

(57) ABSTRACT

According to one embodiment, a semiconductor storage device includes a substrate including an insulating region and a semiconductor region, an insulating film disposed on upper surfaces of the semiconductor region and the insulating region, a first conductive film disposed on an upper surface of the insulating film, and including a terrace region, and a first contact plug disposed on an upper surface of the terrace region of the first conductive film. The insulating region includes an upper surface positioned directly under the first contact plug. A lower surface of the insulating film is in contact with the upper surfaces of the semiconductor region and the insulating region, in the region directly under the terrace region.

11 Claims, 16 Drawing Sheets

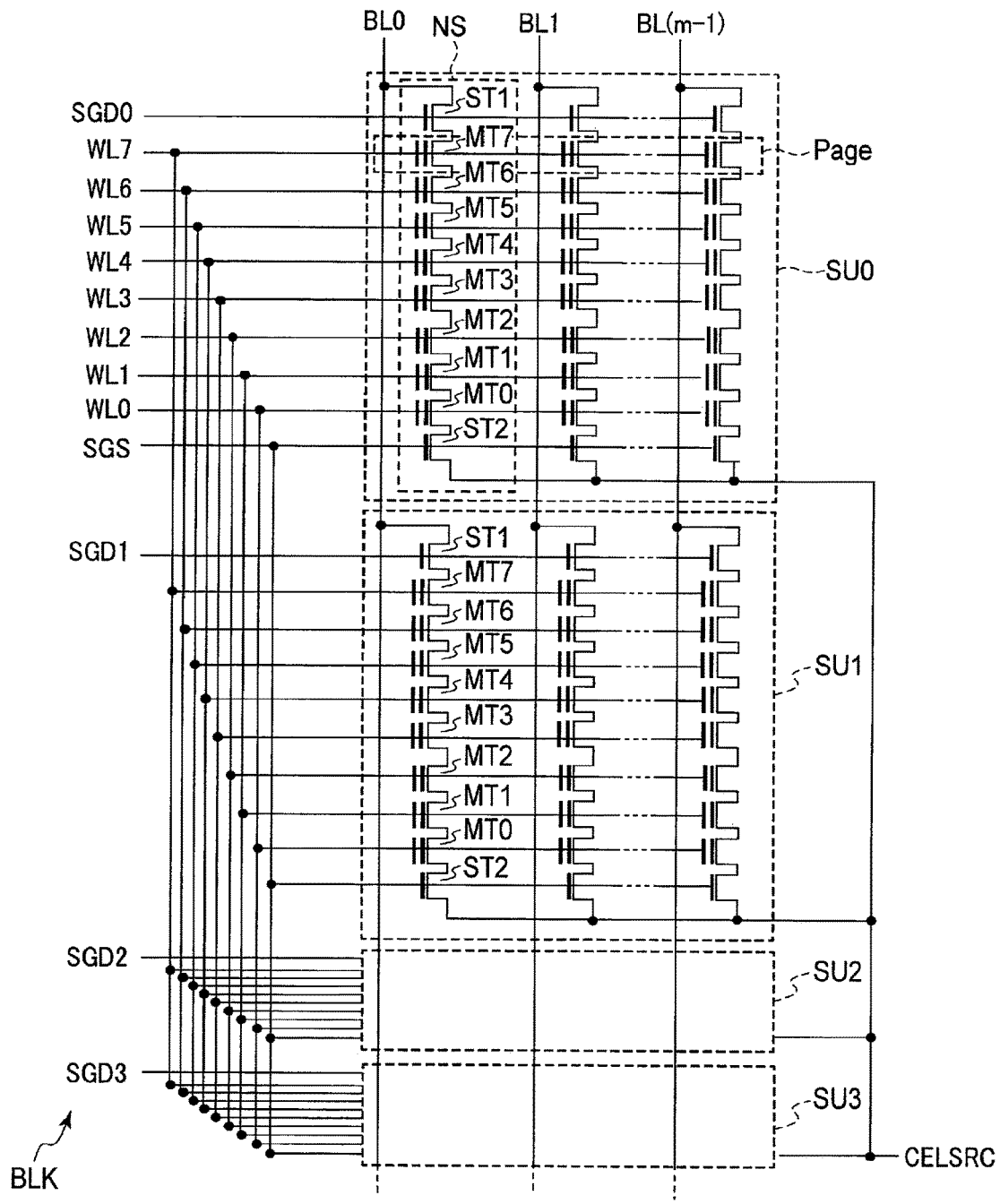
F I G. 2

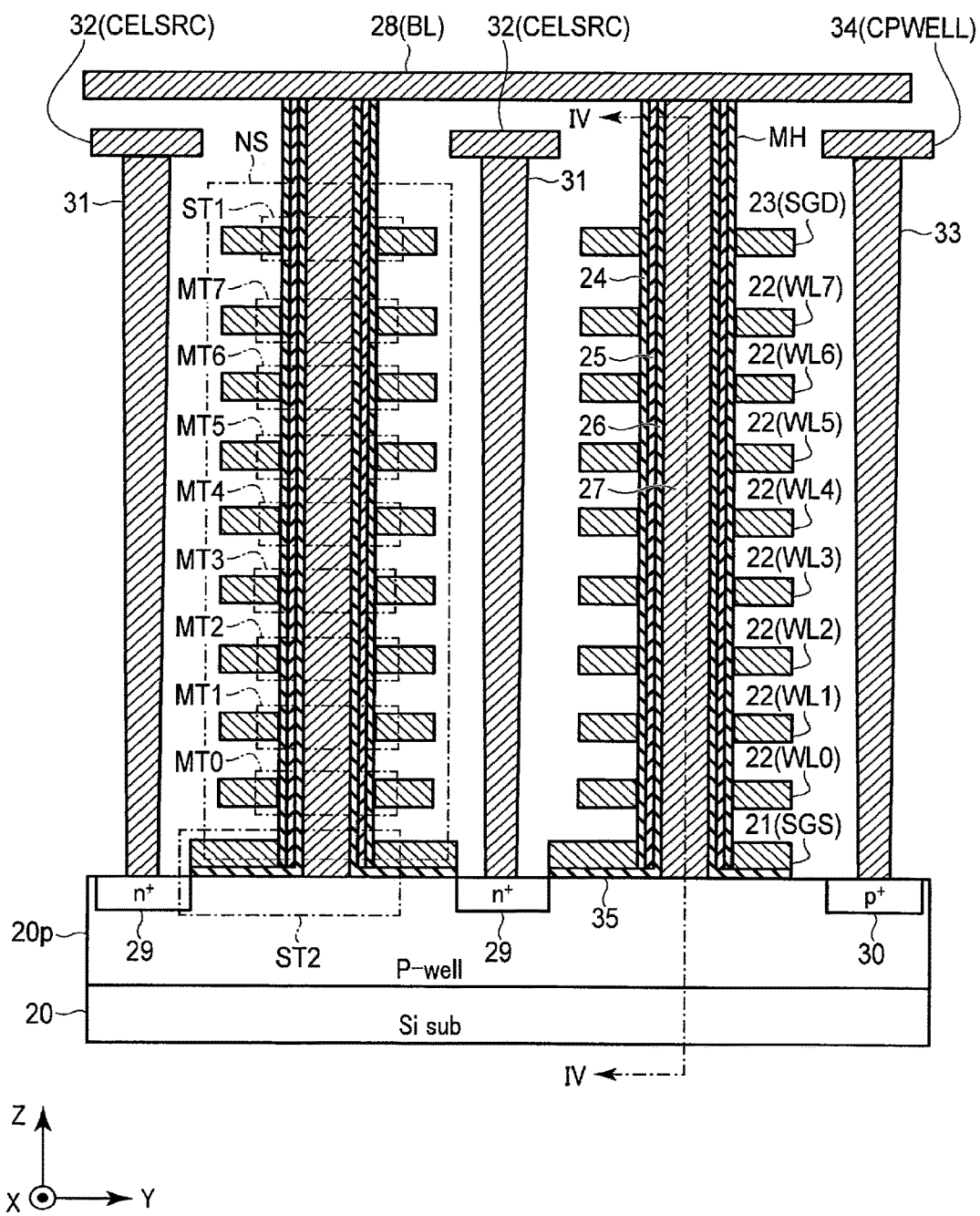
F I G. 3

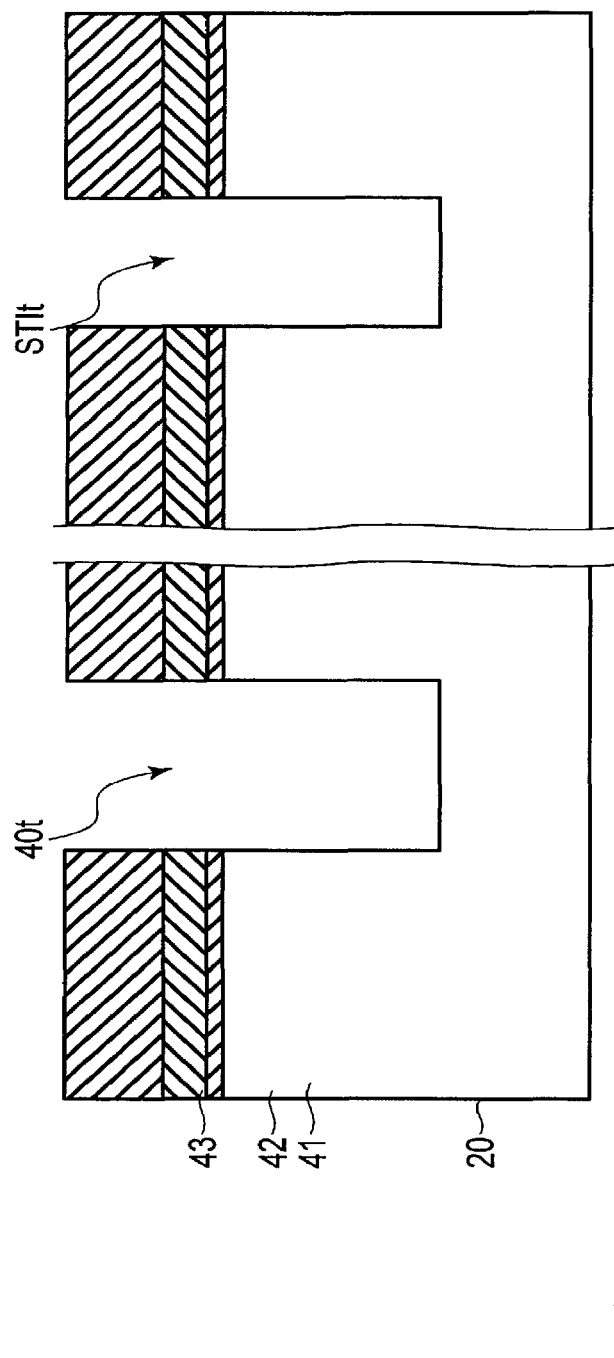
F I G. 8

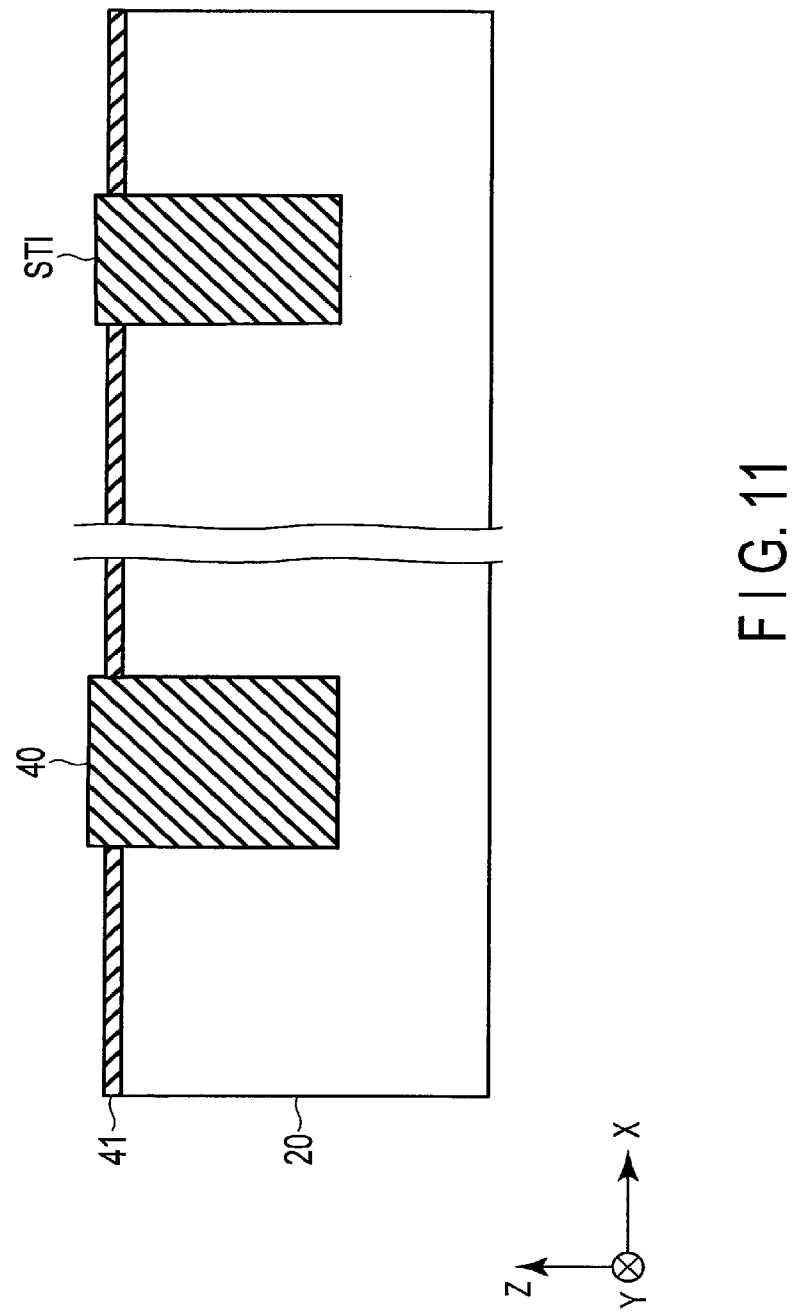
F I G. 11

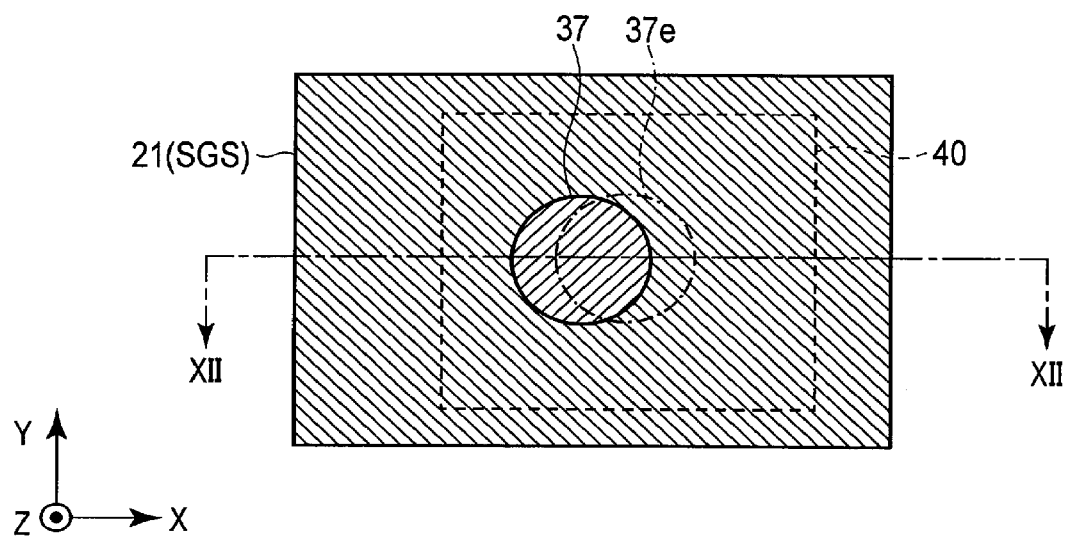
F I G. 12A
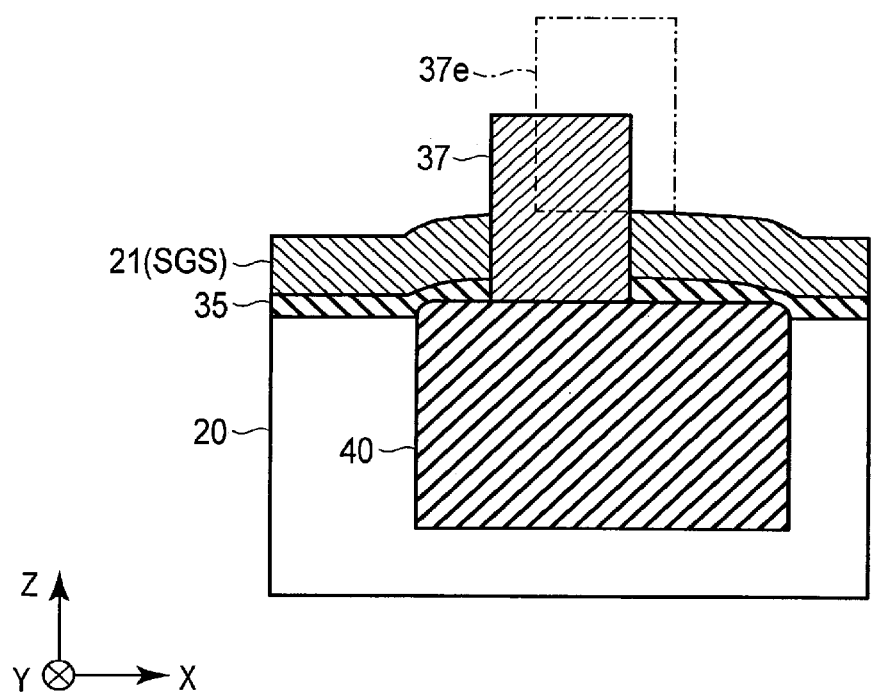
F I G. 12B

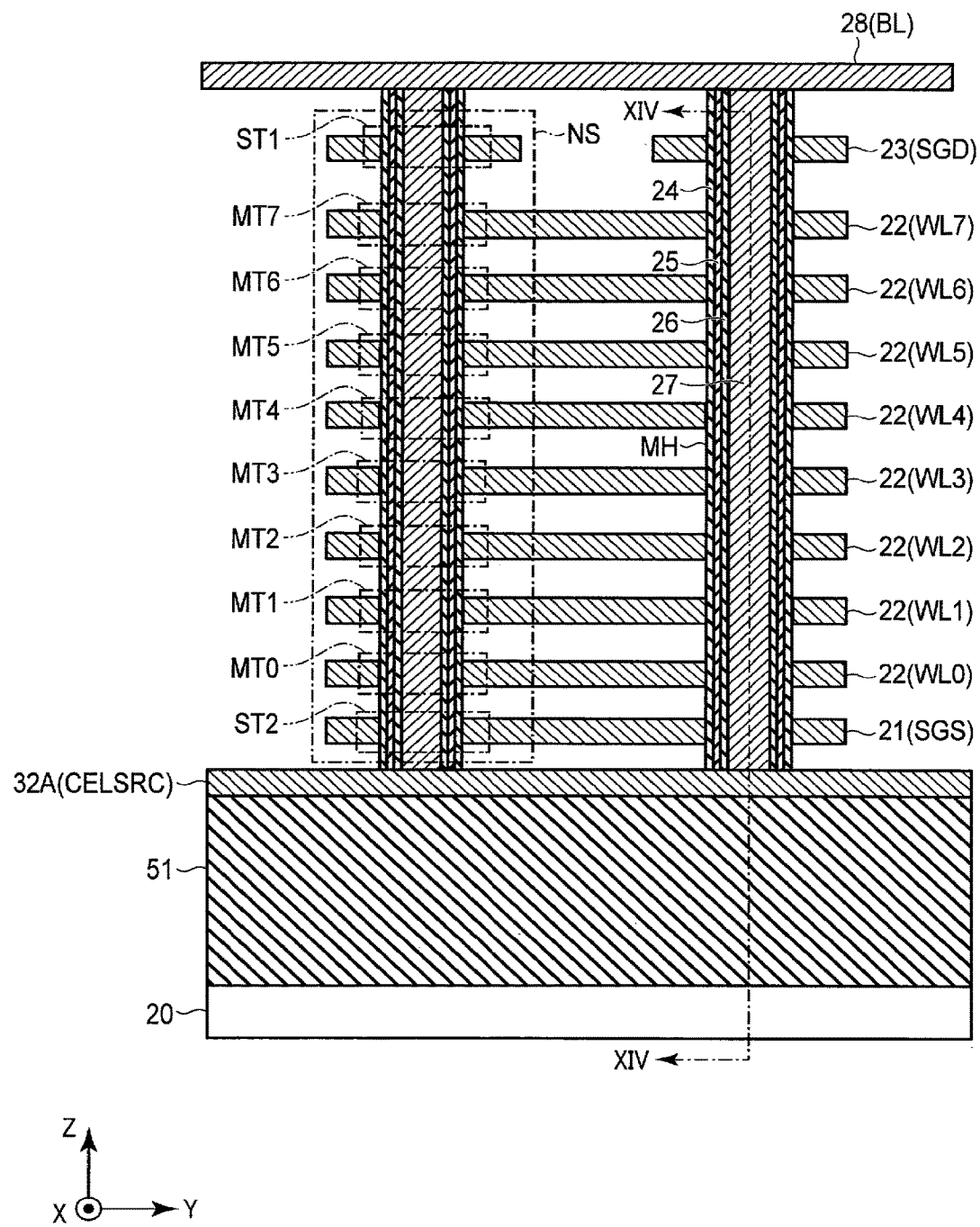
F I G. 13

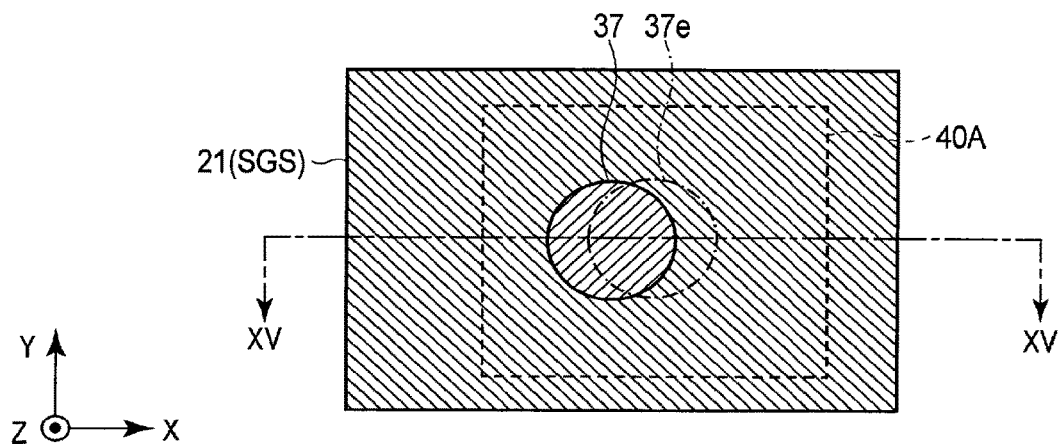
F I G. 15A
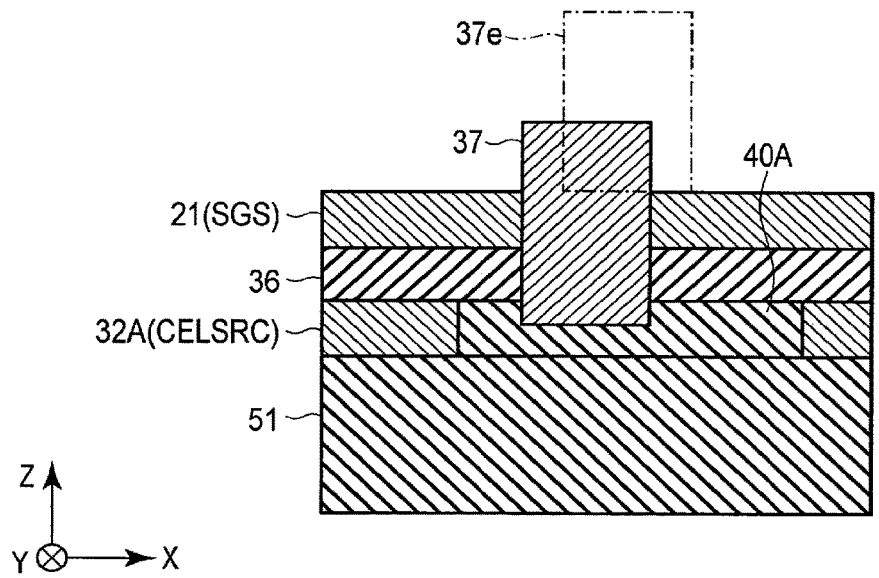
F I G. 15B

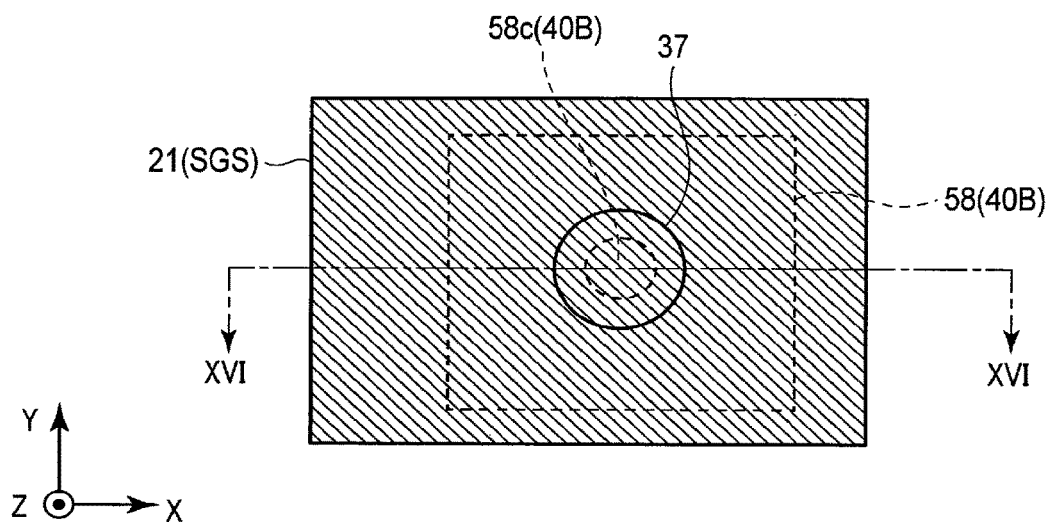
F I G. 16A
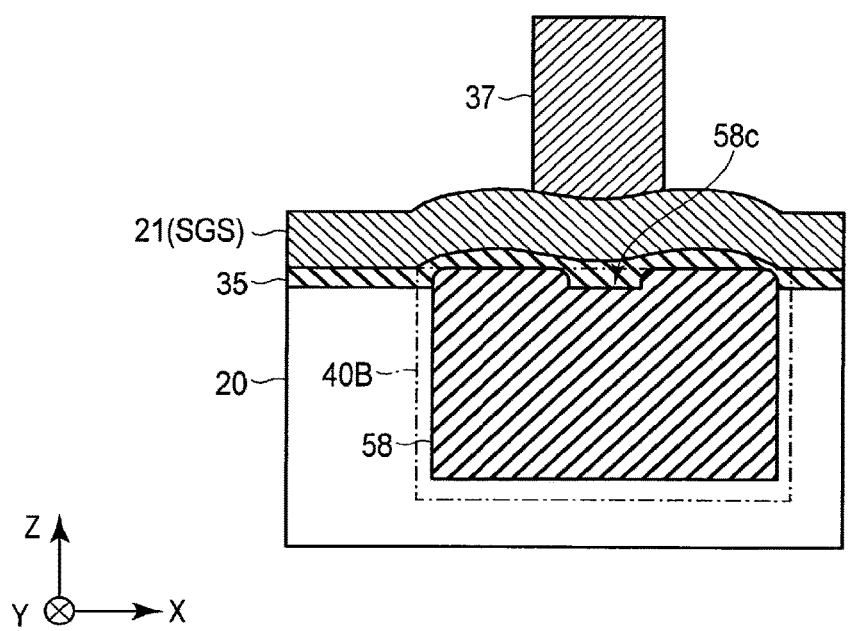
F I G. 16B

US 10,468,430 B2

SEMICONDUCTOR STORAGE DEVICE

CROSS-REFERENCE TO RELATED APPLICATIONS

This application is based upon and claims the benefit of priority from prior Japanese Patent Application No. 2016-048690, filed Mar. 11, 2016, the entire contents of which are incorporated herein by reference.

FIELD

Embodiments described herein relate generally to a semiconductor storage device.

BACKGROUND

A NAND flash memory in which memory cells are stacked in a three-dimensional manner has been known as a semiconductor storage device.

BRIEF DESCRIPTION OF THE DRAWINGS

FIG. 2 is a circuit diagram for explaining a structure of a memory cell array of the semiconductor storage device according to the first embodiment.

FIG. 3 is a cross-sectional view for explaining the structure of the memory cell array of the semiconductor storage device according to the first embodiment.

FIG. 8 is a cross-sectional view for explaining a manufacturing step of the semiconductor storage device according to the first embodiment;

FIG. 11 is a cross-sectional view for explaining a manufacturing step of the semiconductor storage device according to the first embodiment;

FIG. 12A is a schematic diagram for explaining an effect of the semiconductor storage device according to the first embodiment;

FIG. 12B is a schematic diagram for explaining an effect of the semiconductor storage device according to the first embodiment;

FIG. 13 is a cross-sectional view for explaining the structure of a memory cell array of a semiconductor storage device according to a second embodiment;

FIG. 15A is a schematic diagram for explaining an effect of the semiconductor storage device according to the second embodiment;

FIG. 15B is a schematic diagram for explaining an effect of the semiconductor storage device according to the second embodiment;

FIG. 16A is a schematic diagram for explaining a structure of a memory cell array of a semiconductor storage device according to a modification of the first embodiment; and FIG. 16B is a schematic diagram for explaining a structure of a memory cell array of a semiconductor storage device according to a modification of the first embodiment.

DETAILED DESCRIPTION

Figure 1:
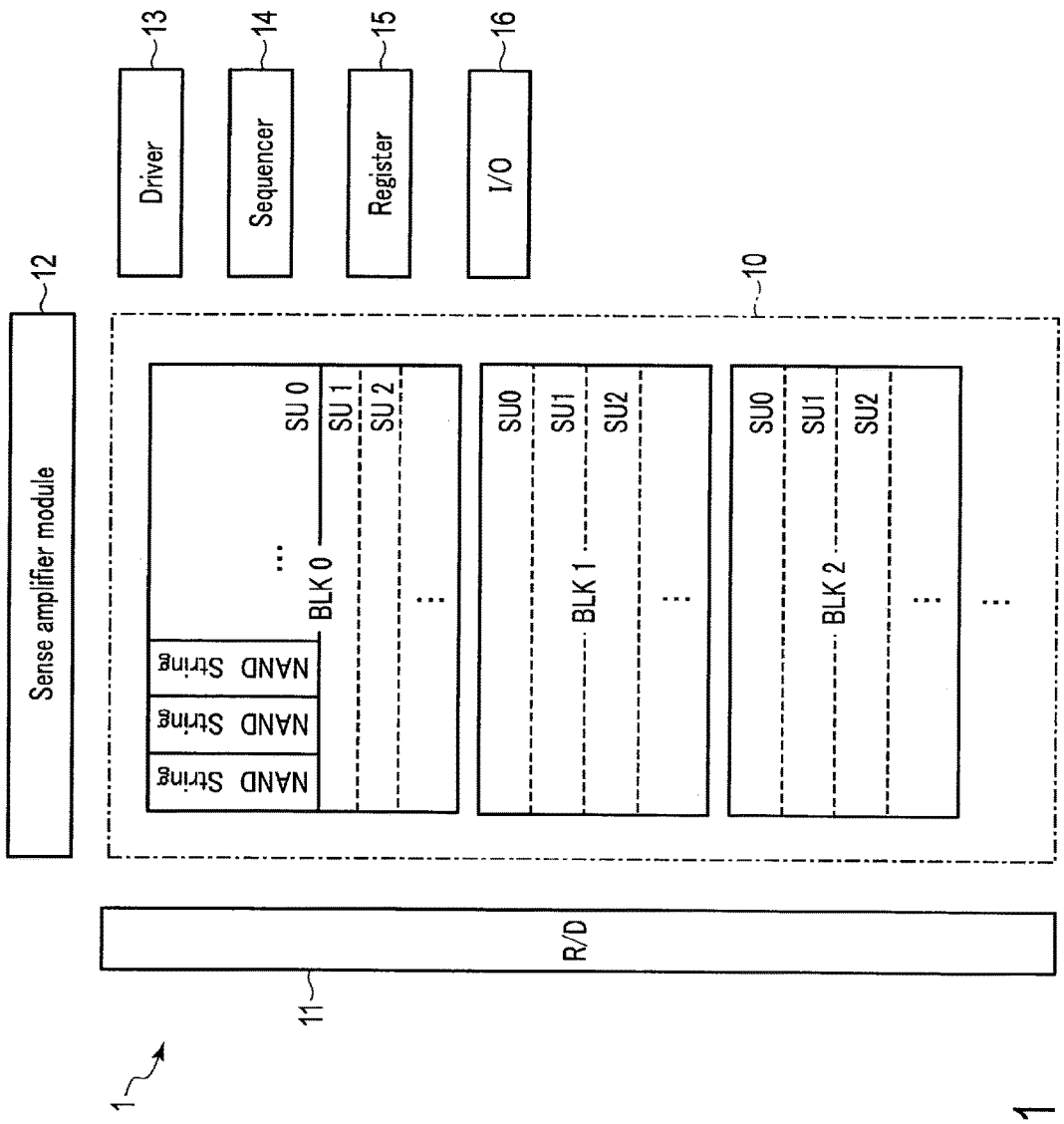
FIG. 1 is a block diagram for explaining a structure of a semiconductor storage device according to a first embodiment.

In general, according to one embodiment, a semiconductor storage device includes: a substrate including an insulating region and a semiconductor region; an insulating film provided on an upper surface of the semiconductor region and an upper surface of the insulating region; a first conductive film provided on an upper surface of the insulating film, and including a first terrace region; and a first contact plug provided on an upper surface of the first terrace region of the first conductive film. The insulating region includes a region directly under the first contact plug, in the upper surface of the insulating region. A lower surface of the insulating film is in contact with the upper surface of the semiconductor region and the upper surface of the insulating region, in the region directly under the first terrace region.

Embodiments will be described hereinafter with reference to the drawings. In the following description, constituent elements having the same function and structure will be denoted by the same reference numerals.

1. First Embodiment

A semiconductor storage device according to a first embodiment will be described hereinafter.

1.1 Structure

1.1.1 Structure of Semiconductor Storage Device

A structure example of a semiconductor storage device according to a first embodiment will be described hereinafter with reference to FIG. 1.

The semiconductor storage device 1 includes a memory cell array 10, a row decoder (R/D) 11, a sense amplifier module 12, a driver 13, a sequencer (controller) 14, a register 15, and an input/output circuit (I/O) 16.

The memory cell array 10 includes a plurality of memory cell transistors. Each of the memory cell transistors is associated with a word line and a bit line and stores data in a nonvolatile manner. The memory cell array 10 includes a plurality of blocks (BLK0, BLK1, BLK2 . . . ), each of which is a group of a plurality of memory cell transistors. A block BLK serves as, for example, a data erase unit, and data in the same block BLK is erased together. Each block BLK includes a plurality of string units SU (SU0, SU1, SU2 . . . ). Each string unit SU is a group of NAND strings NS, in each of which a plurality of memory cell transistors are connected. The number of blocks in the memory cell array 10, the number of string units in one block BLK, the number of NAND strings in one string unit SU, and the number of memory cell transistors in one NAND string NS can be set to desired numbers. In the following description, the area of the memory cell array 10 is referred to as a memory cell array area, and the area of the other peripheral circuits is referred to as a peripheral area. The memory cell array area includes a memory area and a hookup area. The details of each of the areas will be described later.

The row decoder 11 decodes a block address and a page address. The row decoder selects any word line in the corresponding block BLK, and applies proper voltages to the selected word line and non-selected word lines, based on a result of decoding.

When data is read out, the sense amplifier module 12 senses data read from the memory cell transistor to the bit line, and outputs the data to the input/output circuit 16. When data is written, the sense amplifier module 12 transfers the data to be written to the memory cell transistor through the bit line.

The driver 13 generates a voltage necessary for writing and reading of data, and supplies the voltage to the row decoder 11 and the sense amplifier module 12.

The sequencer 14 controls operations of the entire semiconductor storage device 1.

The register 15 retains various signals. For example, the register 15 retains status of a data write operation and an erase operation, and thereby notifies an external controller (not illustrated) whether the operation is normally finished. The register 15 is also capable of retaining commands and addresses received from the external controller, and retaining various tables.

The input/output circuit 16 transmits and receives data to and from the external controller or a host apparatus (not illustrated). For example, when data is read out, the input/output circuit 16 outputs read data sensed by the sense amplifier module 12. When data is written, the input/output circuit 16 transfers write data received from the exterior to the sense amplifier module 12.

1.1.2 Structure of Memory Cell Array

The following is a description of a structure of the memory cell array of the semiconductor storage device according to the first embodiment, with reference to FIG. 2. FIG. 2 illustrates one block BLK included in the memory cell array 10, in an extracted manner. The other blocks BLK have the same structure.

As illustrated in FIG. 2, the block BLK includes, for example, four string units SU (SU0 to SU3). Each of the string units SU includes a plurality of NAND strings NS. Each of the NAND strings NS includes, for example, eight memory cell transistors MT (MT0 to MT7), and select transistors ST1 and ST2.

Each memory cell transistor MT includes a stack gate including a control gate and a charge accumulation layer. The memory cell transistors MT0 to MT7 are connected in series. The select transistors ST1 and ST2 are used for selection of a NAND string NS on which reading or writing of data is performed. One end of the select transistor ST1 is connected with one end of the memory cell transistor MT7. One end of the select transistor ST2 is connected with one end of the memory cell transistor MT0.

The memory cell array 10 is provided with bit lines BL, word lines WL, select gate lines SGD and SGS, and a source line CELSRC.

For example, m bit lines (bit lines BL0 to BL (m−1)) (m is a natural number) are provided. Each of the bit lines BL0 to BL (m−1) is connected in common with the other ends of the select transistors ST1 included in the NAND strings NS corresponding to the same column in the respective string units SU.

For example, eight word lines (word lines WL0 to WL7) are provided. The word lines WL0 to WL7 are connected in common with control gates of memory cell transistors MT0 to MT7, respectively, included in each string unit SU.

For example, four select gate lines SGD (select gate lines SGD0 to SGD3) are provided. The select gate lines SGD0 to SGD3 are connected with gates of respective select transistors ST1 included in the string units SU0 to SU3, respectively.

For example, a select gate line SGS is provided. The select gate line SGD is connected in common with gates of the respective select transistors ST2 of the respective string units SU.

For example, the source line CELSRC is provided in common between the blocks BLK. The source line CELSRC is connected in common with the other ends of the respective select transistors ST2 included in the respective string units SU.

Reading and writing of data are executed together on the memory cell transistors MT in the same string unit SU, connected to the same word line. This unit is dealt with as a page.

1.1.3 Cross-Sectional Structure of Memory Cell Array

The following is a description of a cross-sectional structure of the memory cell array with reference to FIG. 3. FIG. 3 illustrates an example of a cross-sectional structure of the memory area of the memory cell array 10. In the following description, a plane parallel with the surface of a semiconductor substrate 20 is referred to as an XY plane, and a direction perpendicular to the XY plane is referred to as a Z direction. The X direction and the Y direction are orthogonal to each other.

The semiconductor substrate 20 is provided with a p-well region 20p. A plurality of NAND strings NS is provided on the p-well region 20p. Namely, for example, a wiring layer 21 functioning as the select gate line SGS, eight wiring layers 22 functioning as the word lines WL0 to WL7, and a wiring layer 23 functioning as the select gate line SGD are successively stacked above the p-well region 20p. A plurality of wiring layers 21 and 23 may be stacked. An insulating film (not illustrated) is provided between the stacked wiring layers.

The wiring layer 21, for example, electrically connects gates of the respective select transistors ST2 of NAND strings NS in one block BLK. The wiring layers 22 electrically connect control gates of respective memory cell transistors MT of NAND strings NS in one block BLK. The wiring layer 23 electrically connects gates of the respective select transistors ST of NAND strings NS in one string unit SU. The wiring layers 21 to 23 and the insulating films (not illustrated) between the wiring layers 21 to 23 are a flat plate shape, and extend in the X direction on the XY plane.

Memory holes MH are provided to pierce through the wiring layers 23, 22, and 21, and reach the p-well region 20p. A block insulating film 24, a charge accumulation layer (insulating film) 25, and a tunnel oxide film 26 are successively provided on side surfaces of each memory hole MH. A semiconductor pillar (conductive film) 27 is filled into the memory hole MH. The semiconductor pillar 27 is, for example, non-doped polysilicon, and functions as a current path of the NAND string NS. An upper end of the semiconductor pillar 27 is provided with a wiring layer 28 functioning as the bit line BL.

As described above, the select transistor ST2, the memory cell transistors MT, and the select transistor ST1 are successively stacked above the p-well region 20p, and one memory hole MH corresponds to one NAND string NS. A plurality of the structures described above is arranged in the X direction. One string unit SU includes a group of NAND strings NS arranged in a line in the X direction, for example.

An n+ impurity diffusion region 29 and a p+ impurity diffusion region 30 are provided in the surface of the p-well region 20p. A contact plug 31 is provided on an upper surface of the n+ impurity diffusion region 29. A wiring layer 32 functioning as the source line CELSRC is provided on an upper surface of the contact plug 31. A contact plug 33 is provided on an upper surface of the p+ impurity diffusion region 30. A wiring layer functioning as a well line CPWELL is provided on an upper surface of the contact plug 33. The contact plugs 31 and 33 are formed in, for example, a flat plate shape, and extend in the X direction on the XZ plane.

An oxide film 35 is provided between the lowermost wiring layer 21 and the p-well region 20p. The oxide film 35 and the lowermost wiring layer 21 adjacent to the n+ impurity diffusion region 29 are provided in the vicinity of the n+ impurity diffusion region 29. In this manner, when the select transistor ST2 is turned on, part of the p-well region 20p and part of the semiconductor pillar 27 function as a channel region of the select transistor ST2. The channel region of the select transistor ST2 electrically connects the n+ impurity diffusion region 29 with the memory cell transistor MT0. To form a good channel region, the thickness of the oxide film 35 is smaller than the thickness of each of the insulating films (not illustrated) between the wiring layers 21 to 23. The oxide film 35 is formed, for example, in a flat plate shape, and extends in the X direction on the XY plane.

The structure of the memory cell array 10 may be another structure. For example, the structure of the memory cell array 10 is disclosed in U.S. patent application Ser. No. 12/407,403 "Three-dimensional Stacked Nonvolatile Semiconductor Memory" filed on Mar. 19, 2009. The structure is also disclosed in U.S. patent application Ser. No. 12/406,524 "Three-dimensional Stacked Nonvolatile Semiconductor Memory" filed on Mar. 18, 2009, U.S. patent application Ser. No. 12/679,991 "Nonvolatile Semiconductor Storage Device and Method for Manufacturing the Same" filed on Mar. 25, 2010, and U.S. patent application Ser. No. 12/532,030 "Semiconductor Memory and Method for Manufacturing the Same" filed on Mar. 23, 2009. The entireties of these patent applications are cited by reference in the specification of the present application.

1.1.4 Cross-Sectional Structure of Hookup Area

Figure 4:
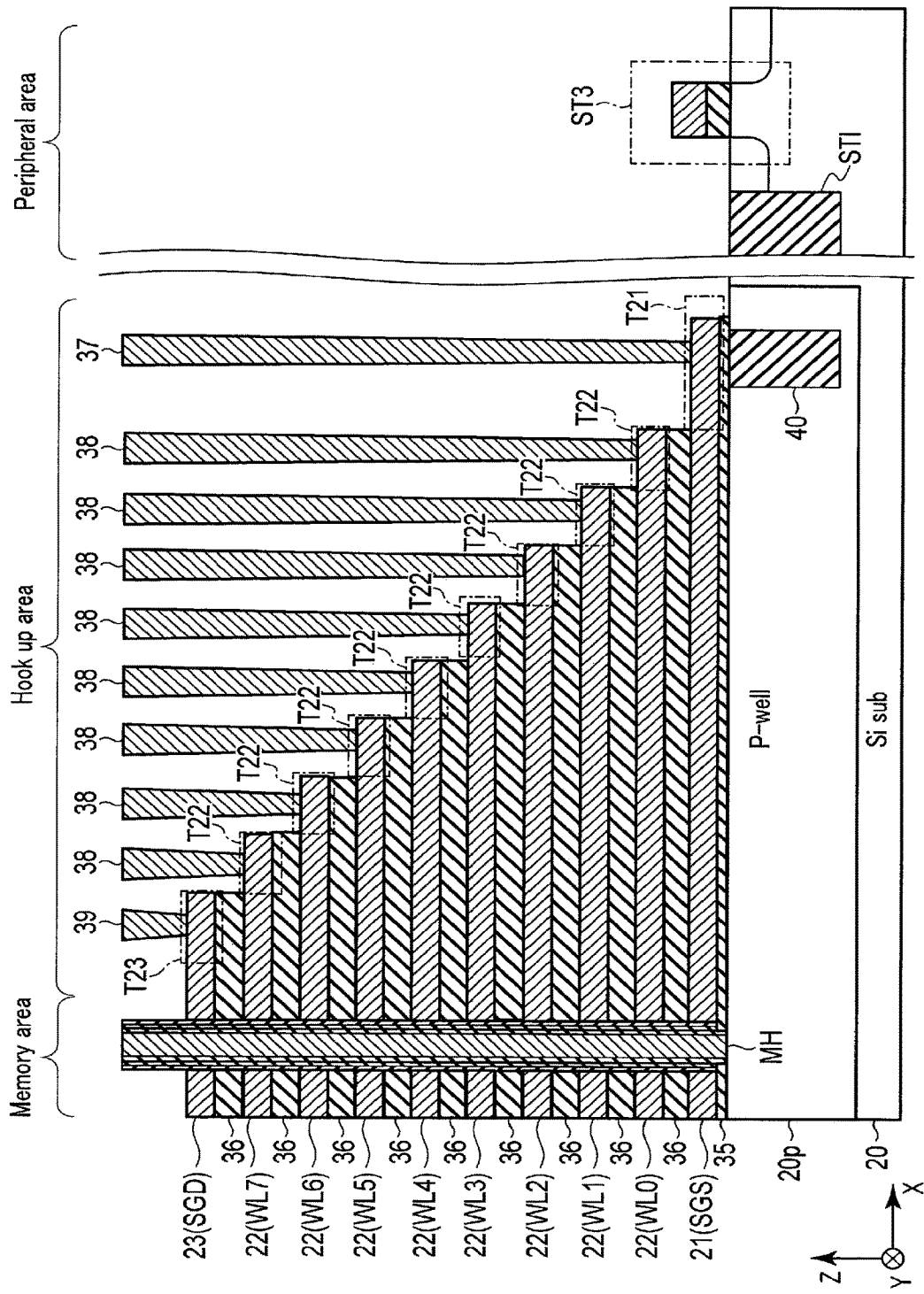
FIG. 4 is a cross-sectional view for explaining the structure of the memory cell array of the semiconductor storage device according to the first embodiment.
Figure 5:
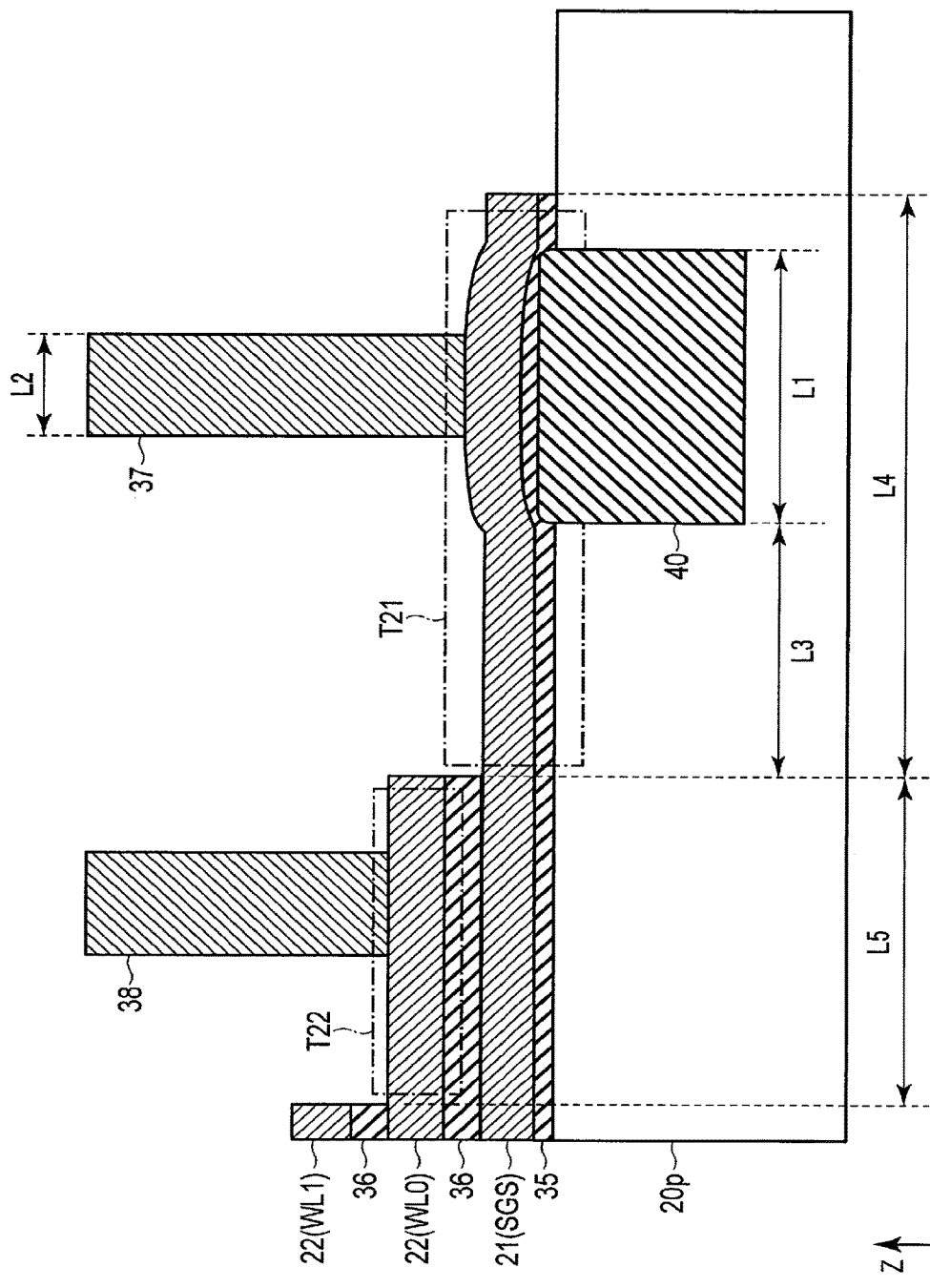
FIG. 5 is a cross-sectional view for explaining the structure of the memory cell array of the semiconductor storage device according to the first embodiment.

The following is a cross-sectional structure of the hookup area and the peripheral area with reference to FIG. 4 and FIG. 5. FIG. 4 is a cross-sectional view taken along line IV-IV illustrated in FIG. 3, illustrating an example of a cross section of the memory area, the hookup area, and the peripheral area along the X direction. FIG. 5 is an enlarged view of part of the cross-sectional view of the hookup area illustrated in FIG. 4.

First, the hookup area will be described hereinafter. As illustrated in FIG. 4, the memory area, the hookup area, and the peripheral area are arranged along the X direction, for example. The wiring layers 21 to 23, the insulating film 36, and the oxide film 35 extend from the memory area side along the X direction, and reach the hookup area. In the hookup area, the wiring layers 21 to 23 are drawn in a stair shape along the X direction. Namely, the lengths of the respective wiring layers 21 to 23 extending from the memory area side in the X direction are different between the layers, and the length of the lower wiring layer is longer. More specifically, in the hookup area, the wiring layer 23 has a shorter length extending from the memory area side in the X direction than those of the wiring layers 22 and 21. Each of the wiring layers 22 has a shorter length extending from the memory area side in the X direction than those of the lower wiring layer 22 and the wiring layer 21. The wiring layer 21 has a longer length extending from the memory area side in the X direction than those of the wiring layers 22 and 23. Accordingly, the wiring layers 21 to 23 have respective terrace regions T21 to T23 that are provided with no wiring layers above positioned in the upper layer. Contact plugs 37 to 39 are provided on upper surfaces of the respective terrace regions T21 to T23 of the wiring layers 21 to 23. The contact plugs 37 to 39 extend in the Z direction, for example.

The example of FIG. 4 illustrates the case where the wiring layers 21 to 23 are drawn in a stair shape in a line along the Y direction, but the structure is not limited thereto. Various stair shaped structures may be applied. For example, the wiring layers 21 to 23 may have a shape of a stair arranged in two lines along the Y direction, to shorten the wiring length in the X direction.

An insulating region 40 is provided in the surface of the p-well region 20p. The insulating region 40 is a shallow trench isolation (STI) structure, and is provided by embedding an oxide film in a trench provided in the surface of the semiconductor substrate 20. In a region directly under the terrace region T21, the lower surface of the oxide film 35 is in contact with both the insulating region 40 and the p-well region 20p. The insulating region 40 includes a region directly under the contact plug 37, in the surface of the p-well region 20p. More specifically, a region in which a lower end of the contact plug 37 is projected onto the surface of the p-well region 20p in the Z direction is included in the insulating region 40. The lower end of the insulating region 40 may be disposed lower than the lower end of the p-well region 20p.

A detailed cross-sectional structure around the insulating region 40 will be described with reference to FIG. 5. As illustrated in FIG. 5, the insulating region 40 bulges in the Z direction with respect to the surface of the p-well region 20p. With this structure, a region of the oxide film 35 provided on the upper surface of the insulating region 40 bulges in the Z direction to be higher than the other region of the oxide film 35. A region of the wiring layer 21 provided on the upper surface of the bulged region of the oxide film 35, bulges in the Z direction to be higher than the other region of the wiring layer 21. The contact plug 37 is provided on the upper surface of the bulged region of the wiring layer 21.

As described above, the region obtained by extending the contact plug 37 downward is included in the insulating region 40, in the surface of the p-well region 20p. Accordingly, a length L1 of the insulating region 40 in the X direction is longer than a length L2 of the contact plug 37 in the X direction. More specifically, in consideration of the case where the position of the contact plug 37 is shifted in the X direction due to a manufacturing error, the length L1 (for example, 180 nm) is preferably substantially three times as long as the length L2 (for example, 60 nm).

In addition, the region of the wiring layer 21 bulging in the Z direction may interfere with one end of the wiring layer 22 provided in the next upper layer. Interference may cause, for example, a short circuit between the wiring layers 21 and 22. For this reason, a length L3 in the X direction between the insulating region 40 and the wiring layer 22 is set to be sufficiently long to prevent interference between the wiring layers 21 and 22 due to the bulge of the wiring layer 21. By contrast, because no insulating region 40 is provided directly under the terrace region T22 of the wiring layer 22, it is unnecessary to consider interference as described above. Accordingly, a length L4 (>L3+L1) of the terrace region T21 of the wiring layer 21 in the X direction is set longer than a length L5 of the terrace region T22 of the wiring layer 22 in the X direction.

The following is a description of the peripheral area, with reference to FIG. 4 again. A device isolation region STI and, for example, a transistor ST3 serving as a peripheral circuit are provided on the semiconductor substrate 20 in the peripheral area, for example, outside the region of the p-well region 20p.

The device isolation region STI has an STI structure, and, for example, isolates the memory area and the hookup area from the peripheral area. The device isolation region STI is provided by embedding an oxide film in a trench provided in the surface of the semiconductor substrate 20. The transistor ST3 is, for example, isolated with the device isolation region STI from the semiconductor substrate 20 including the memory area and the hookup area.

The insulation region 40 and the device isolation region STI have a substantially equal depth in the Z direction. The insulation region 40 and the device isolation region STI may have different depths in the Z direction, and are not limited thereto.

The insulation region 40 and the device isolation region STI are provided together, for example, by the same step. Accordingly, the oxide films embedded into the insulation region 40 and the device isolation region STI are formed of the same material.

1.1.5 Plane Structure of Memory Cell Array

Figure 6:
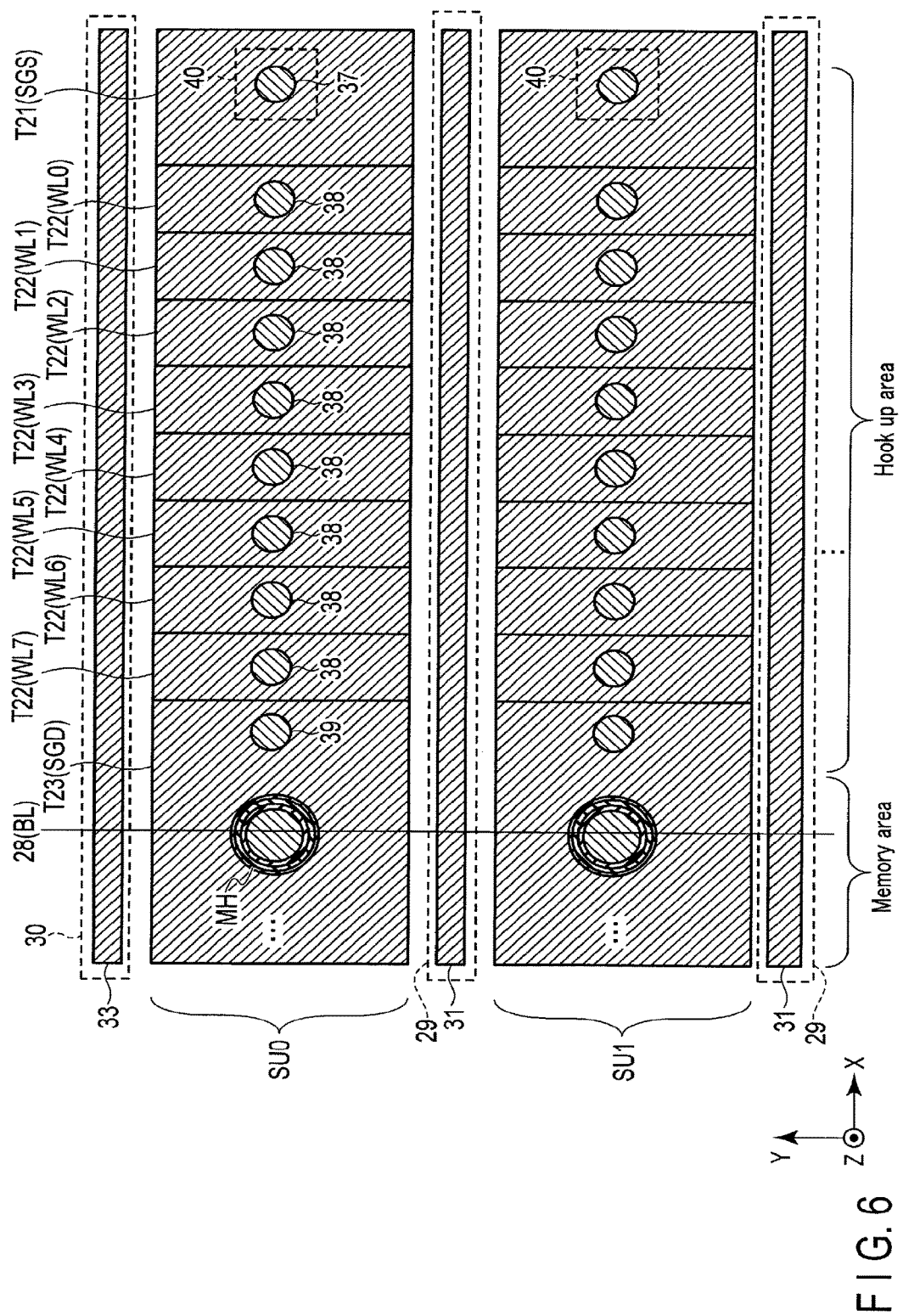
FIG. 6 is a cross-sectional view for explaining a manufacturing step of the semiconductor storage device according to the first embodiment.

The following is a description of a plane arrangement of the memory cell array with reference to FIG. 6. FIG. 6 is a top view of the memory cell array 10, illustrating two string units SU (SU0 and SU1) extending over the memory area and the hookup area.

As illustrated in FIG. 6, the n+ impurity diffusion region 29 and the p+ impurity diffusion region 30 are arranged, for example, along the Y direction. The string unit SU0 is provided between, for example, the contact plug 31 provided on the n+ impurity diffusion region 29, and the contact plug 33 provided on the p+ impurity diffusion region 30. The string unit SU1 is provided between two contact plugs 31 provided on the two n+ impurity diffusion regions 29 arranged along, for example, the Y direction.

In each of the string units SU, for example, a plurality of memory holes MH is arranged along the X direction in the memory area. The memory holes MH provided in the same column in each of the string units SU0 and SU1 are electrically connected with the same bit line BL.

Various arrangements may be applied to the memory holes MH. For example, the memory holes MH may be arranged in a line along the X direction, or may be arranged in a staggered manner or in a matrix on the XY plane.

In addition, in each string unit SU, a plurality of contact plugs 37 to 39 is arranged along the X direction in, for example, the hookup area. The contact plugs 37 to 39 are connected with the respective upper wiring layers that are not illustrated. In the example of FIG. 6, the word lines WL0 to WL7 of the string unit SU0 are electrically connected with the word lines WL0 to WL7 of the string unit SU1 in the upper wiring layer, respectively, via the contact plugs 38. Also, for example, the select gate line SGS of the string unit SU0 is electrically connected with the select gate line SGS of the string unit SU1 in the upper wiring layer via the contact plug 37. The select gate lines SGS of the respective string units SU0 to SU3 may separately drive the respective string units SU to SU3 through the contact plugs 37, without being connected in the upper wiring layer.

The hookup area may be provided with a plurality of dummy pillars (not illustrated) piercing through the word lines WL and the select gate lines SGD and SGS, and connected with the semiconductor substrate 20. In this case, each dummy pillar is provided with an insulating film (not illustrated) formed on side surfaces thereof, and the dummy pillars are not electrically connected with the word lines WL and the select gate lines SGD and SGS. The dummy pillars are not electrically connected with other wires.

As described above, the insulating region 40 includes a region in which the lower end of the contact plug 37 is projected onto the semiconductor substrate 20 in the Z direction. Accordingly, when the hookup area is viewed from above, the region occupied by the contact plug 37 is included in the region occupied by the insulating region 40. The insulating region 40 is provided to correspond to each contact plug 37 provided in each string unit SU. Each insulating region 40 extends in, for example, a rectangular region having each side longer than the diameter of the contact plug 37.

1.2 Manufacturing Method

The following is a description of a method for manufacturing the insulating region and the device isolation region with reference to FIG. 7 to FIG. 11. FIG. 7 to FIG. 11 illustrate respective manufacturing steps of the insulating region 40 and the device isolation region STI in the hookup area and the peripheral area.

Figure 7:
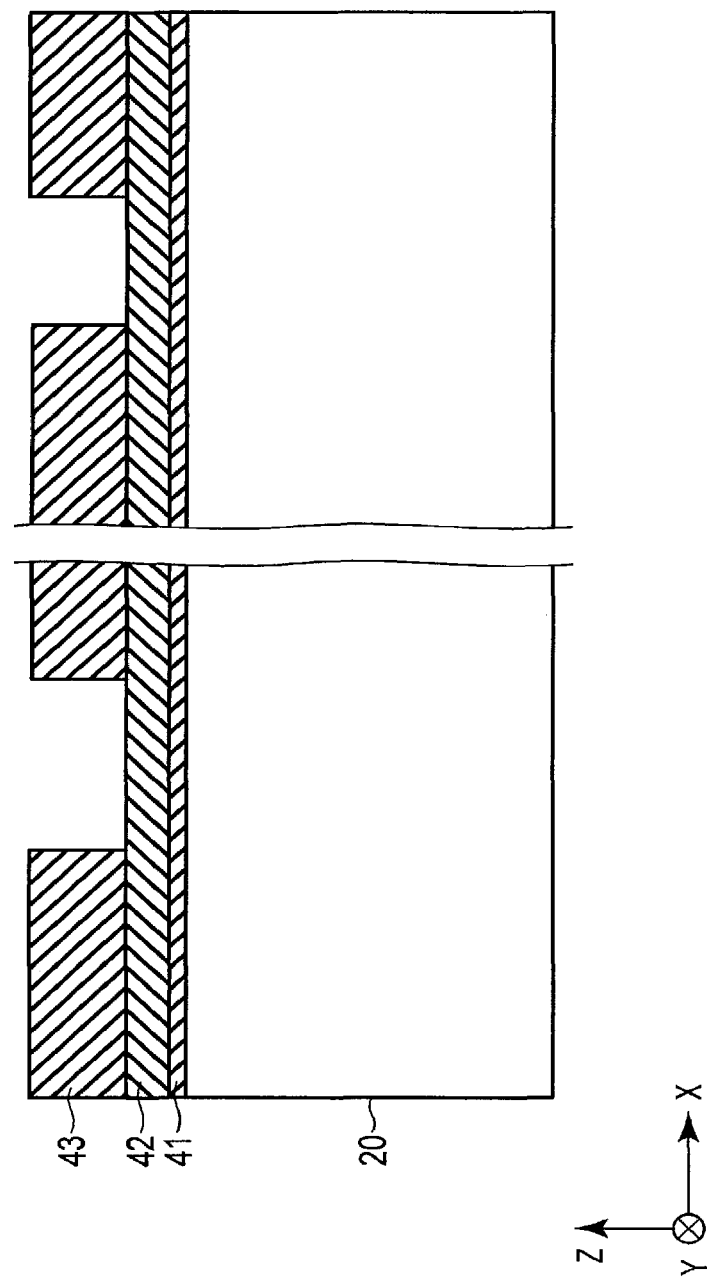
FIG. 7 is a cross-sectional view for explaining a manufacturing step of the semiconductor storage device according to the first embodiment.

First, as illustrated in FIG. 7, an oxide film is formed on the semiconductor substrate 20, and a nitride film is deposited on the oxide film 41. The oxide film 41 is, for example, a silicon oxide film ($SiO_2$), and the nitride film 42 is formed of, for example, nitride silicon ($SiN_2$). Thereafter, a resist 43 is deposited on the nitride film 42. The resist 43 is patterned by photolithography.

Next, as illustrated in FIG. 8, the nitride film 42, the oxide film 41, and the surface of the semiconductor substrate are etched by anisotropy etching, with the resist 43 used as a mask. For example, ion beam etching (IBE) or reactive ion etching (RIE) is used as anisotropy etching. In this manner, the surface of the semiconductor substrate is provided with a trench 40t to be provided with the insulating region 40, and a trench STIt to be provided with the device isolation region STI.

Figure 9:
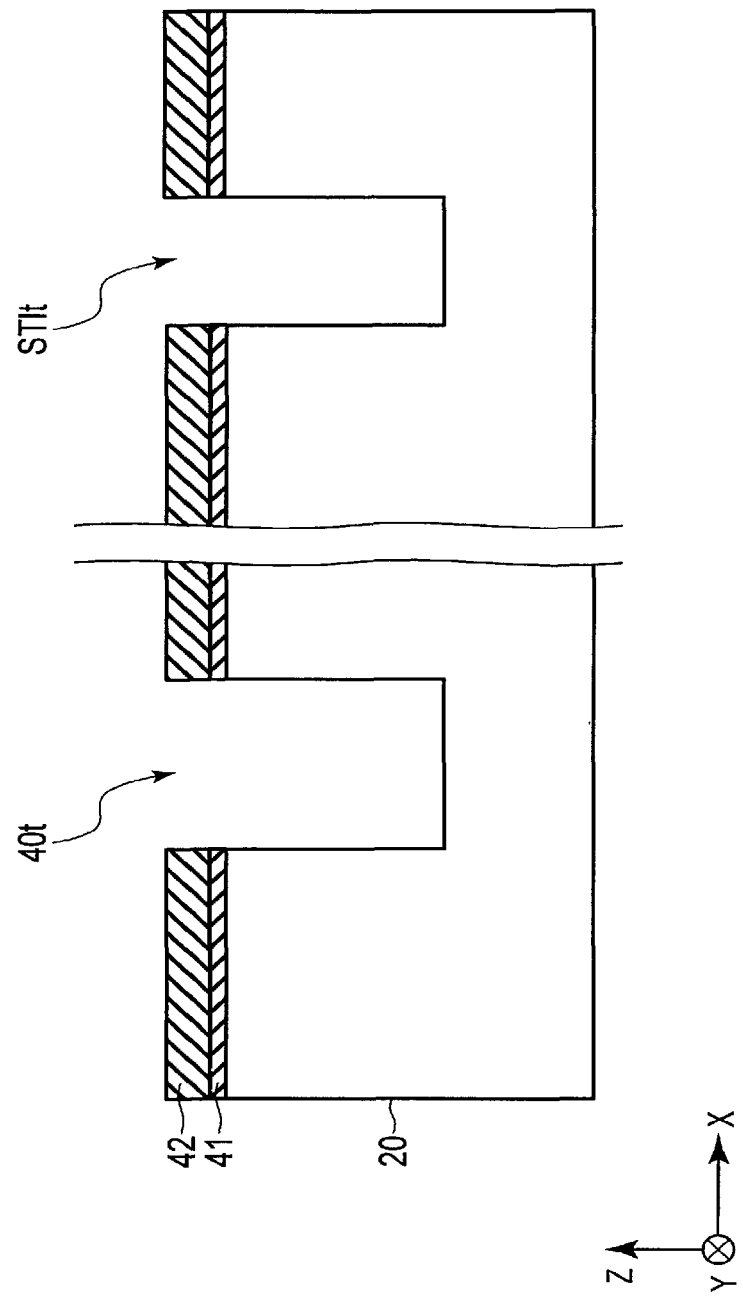
FIG. 9 is a cross-sectional view for explaining a manufacturing step of the semiconductor storage device according to the first embodiment.

Next, as illustrated in FIG. 9, the resist 43 remaining on the semiconductor substrate 20 is removed.

Figure 10:
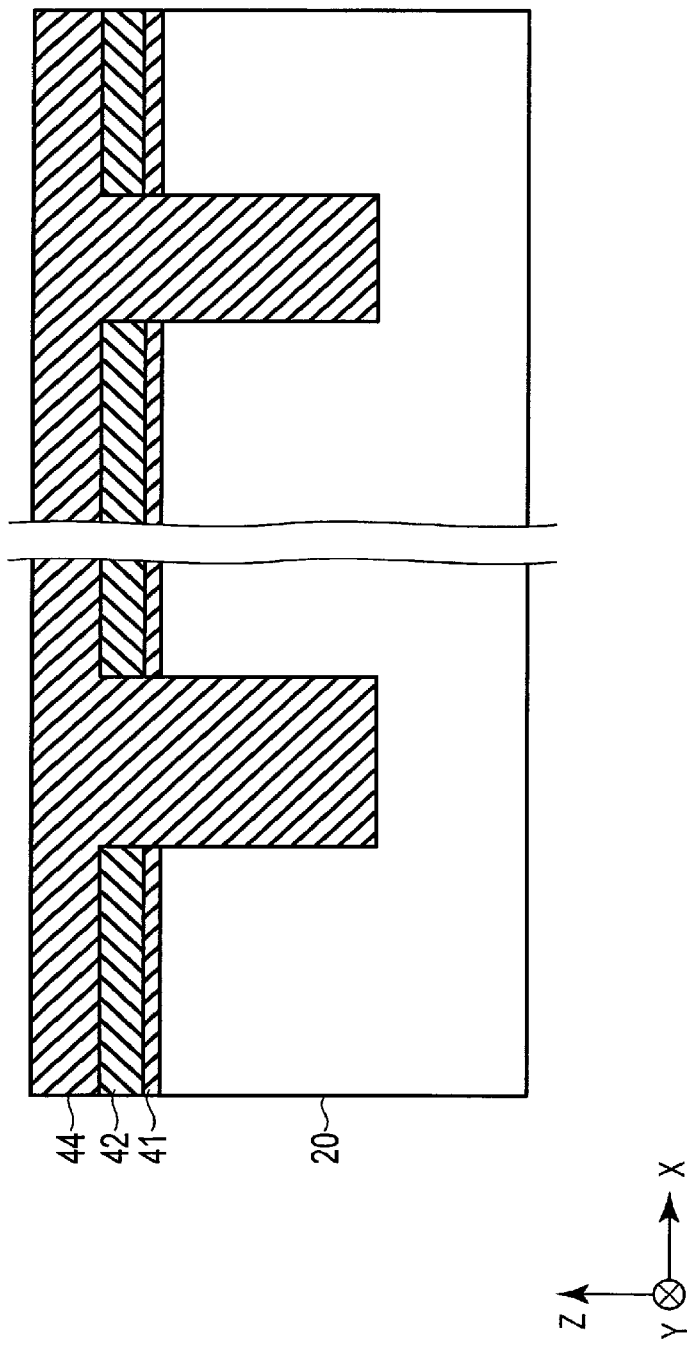
FIG. 10 is a cross-sectional view for explaining a manufacturing step of the semiconductor storage device according to the first embodiment.

Thereafter, as illustrated in FIG. 10, an oxide film 44 is provided to cover the trench 40t and the trench STIt by chemical vapor deposition (CVD) or the like. The oxide film 44 is, for example, a silicon oxide film ($SiO_2$).

Next, as illustrated in FIG. 11, the oxide film 44 deposited on the surface of the nitride film 42 is removed with the nitride film 42 used as a stopper, by chemical mechanical polishing (CMP) or the like. Thereafter, the nitride film 42 is removed. Parts of the oxide film 44 covering the trench 40t and the STIt are left separately, to function as the insulating region 40 and the device isolation region STI. Each of the insulating region 40 and the device isolation region STI has a shape bulging from the surface of the semiconductor substrate 20.

As described above, the insulating region 40 and the device isolation region STI are provided simultaneously. Thereafter, the process returns to an ordinary manufacturing process, and the memory cell array 10 and the like are provided on the semiconductor substrate 20.

1.3 Effects of the Present Embodiment

The first embodiment suppresses occurrence of short circuit. This effect will be described hereinafter.

The nonvolatile semiconductor storage device of a three-dimensional stacked type has a structure in which the word lines are stacked in the height direction with respect to the semiconductor substrate. The word lines stacked in the height direction are drawn in a stair shape, and connected to contact plugs to further draw the word lines in the height direction. The contact plugs are provided by embedding conductive films in contact holes provided by etching. However, when excessive etching is performed during generation of the contact holes, the contact holes may go through the select gate lines. In particular, because a deepest contact hole is required to be generated for the select gate line of the lowermost layer, an etching error in the Z direction easily occurs. In addition, the insulating film provided between the select gate line of the lowermost layer and the semiconductor substrate may be set to have a smaller thickness than that of the insulating films provided between the other layers. Accordingly, when the contact hole provided for the word line of the lowermost layer goes through the word line, the contact hole may further go through the insulating film of the lower layer, and may reach the semiconductor substrate. The contact plug electrically connected with the semiconductor substrate may cause a short circuit. In other words, there is room for considering that conventional semiconductor storage devices may possibly cause the occurrence of a short circuit.

The semiconductor storage device according to the first embodiment has the structure in which the semiconductor substrate 20 is provided with the insulating region 40 to correspond to the contact plug 37 provided on the wiring layer 21 functions as the select gate line SGS of the lowermost layer. The insulating region 40 includes a region obtained by extending the contact plug 37 downward in the upper surface of the insulating region 40, and the region directly under the terrace region T21 of the wiring layer 21 includes the upper surface of the semiconductor substrate 20. This structure prevents a short circuit between the wiring layer 21 and the semiconductor layer 20, even when a manufacturing error occurs in the position and the depth of the contact hole when the contact hole of the contact plug 37 is provided. A specific example thereof is described hereinafter with reference to FIGS. 12A and 12B.

FIGS. 12A and 12B illustrate the case where a manufacturing error occurs in the position and the depth in which the contact hole of the contact plug 37 is provided, in the semiconductor storage device according to the first embodiment. FIG. 12A is a top view of the insulating region 40 and a region around the insulating region 40, and FIG. 12B is a cross-sectional view taken along line XII-XII illustrated in FIG. 12A.

As illustrated in FIG. 12A, the contact plug 37 is provided in a position shifted from the contact plug 37e in the case of being provided in an expected predetermined position. However, because the length of each side of the insulating region 40 is sufficiently (for example, substantially three times) longer than the diameter of the contact plug 37, the contact plug 37 is positioned within a region directly on the insulating region 40. Accordingly, the insulating region 40 includes the region in which the contact plug 37 is projected onto the surface of the semiconductor substrate 20 in the Z direction.

In addition, as illustrated in FIG. 12B, the contact plug 37 is provided at a depth shifted from the contact plug 37e in the case of being provided at a predetermined depth. Specifically, the contact plug 37 pierces through the wiring layer 21 and the oxide film 35, and reaches to a position deeper than the surface of the semiconductor substrate 20. However, the insulating region 40 is provided with a depth substantially equal to the depth of the device isolation region STI (not illustrated). Accordingly, even when the contact hole pierces through the wiring layer 21 and the oxide film 35, the contact hole does not pierce through the insulating region 40. As described above, the contact plug 37 does not contact the semiconductor substrate 20. Accordingly, the semiconductor storage device 1 according to the first embodiment prevents the occurrence of a short circuit.

In addition, the terrace region T21 of the wiring layer 21 is configured to be longer in the X direction than the terrace region T22 of the wiring layer 22. This structure enables the terrace region T21 to secure the length L3 in the X direction from the wiring layer 21 to the insulating region 40. This structure prevents interference between the bulging portion of the wiring layer 21 and the wiring layer 22, even when the wiring layer 21 bulges by providing the insulating region 40 in the same manufacturing step as that for the device isolation region STI.

According to a first mode of the first embodiment, the insulating region 40 bulges with respect to the semiconductor substrate 20. When it is further explained, the device isolation region STI having the same STI structure as that of the insulating region 40 is provided in the upper surface of the semiconductor substrate 20. To omit the manufacturing step, a step of flattening the device isolation region STI with respect to the semiconductor substrate 20 may be omitted. For this reason, the device isolation region STI bulges with respect to the semiconductor substrate 20. By contrast, the insulating region 40 is preferably provided in the step of providing the device isolation region STI, to suppress an increase in the number of manufacturing steps. For this reason, when the step of flattening the device isolation region STI with respect to the semiconductor substrate 20 is omitted in the manufacturing steps of the device isolation region STI, the step of flattening the surface of the insulating region 40 with respect to the semiconductor substrate 20 is preferably omitted in the same manner. Accordingly, when no new step is added, the insulating region 40 bulges with respect to the semiconductor substrate 20. In other words, the insulating region 40 can be provided without adding a new step, while the insulating region 40 has a bulging shape with respect to the semiconductor substrate 20.

According to a second mode of the first embodiment, the insulating region 40 is formed of the same material (such as a silicon oxide film) as that of the device isolation region STI. This structure enables manufacturing of the insulating region 40 in the same step as that of the device isolation region STI.

2. Second Embodiment

The following is a description of a semiconductor storage device according to a second embodiment. The semiconductor storage device according to the second embodiment prevents a short circuit between the source line CELSRC and the gate line SGS, in the case where the source line CELSRC is disposed under the select gate line SGS. In the following description, constituent elements that are the same as those in the first embodiment are denoted by the same respective reference numerals and description thereof is omitted, and only parts different from the first embodiment will be described.

2.1 Cross-Sectional Structure of Memory Cell Array

The following is a description of a cross-sectional structure of a memory cell array of the semiconductor storage device according to the second embodiment, with reference to FIG. 13. FIG. 13 illustrates an example of the cross-sectional structure of a memory area of the memory cell array 10.

An insulating film 51 is provided on the semiconductor substrate 20. A wiring layer 32A functioning as the source line CELSRC is provided on an upper surface of the insulating film 51. The wiring layer 32A is connected with a plurality of blocks BLK in common. The wiring layer 32A extends in a flat shape on an XY plane over the blocks BLK.

A plurality of NAND strings NS is provided above the wiring layer 32A. Specifically, for example, a wiring layer 21 functioning as the select gate line SGS, for example, eight wiring layers 22 functioning as word lines WL0 to WL7, and a wiring layer 23 functioning as the select gate line SGD are successively stacked on the wiring layer 32A. Insulating films (not illustrated) are provided between the stacked wiring layers 21 to 23 and 32A.

Memory holes MH are provided to pierce through the wiring layers 23, 22, and 21 and reach the wiring layer 32A. Accordingly, in the same manner as the first embodiment, a select transistor ST2, a plurality of memory cell transistors MT, and a select transistor ST1 are successively stacked above the wiring layer 32A, and one memory hole MH corresponds to one NAND string NS. A plurality of the structures described above is arranged in the X direction. One string unit SU includes a group of a plurality of NAND strings NS arranged in a line, for example, in the X direction.

In the example of FIG. 13, the wiring layers 21 and 22 connect the NAND strings arranged along the Y direction, for example. Source regions of the respective select transistors ST2 of the NAND strings in each block BLK are connected with the wiring layer 32A in common.

2.2 Cross-Sectional Structure of Hookup Area

Figure 14:
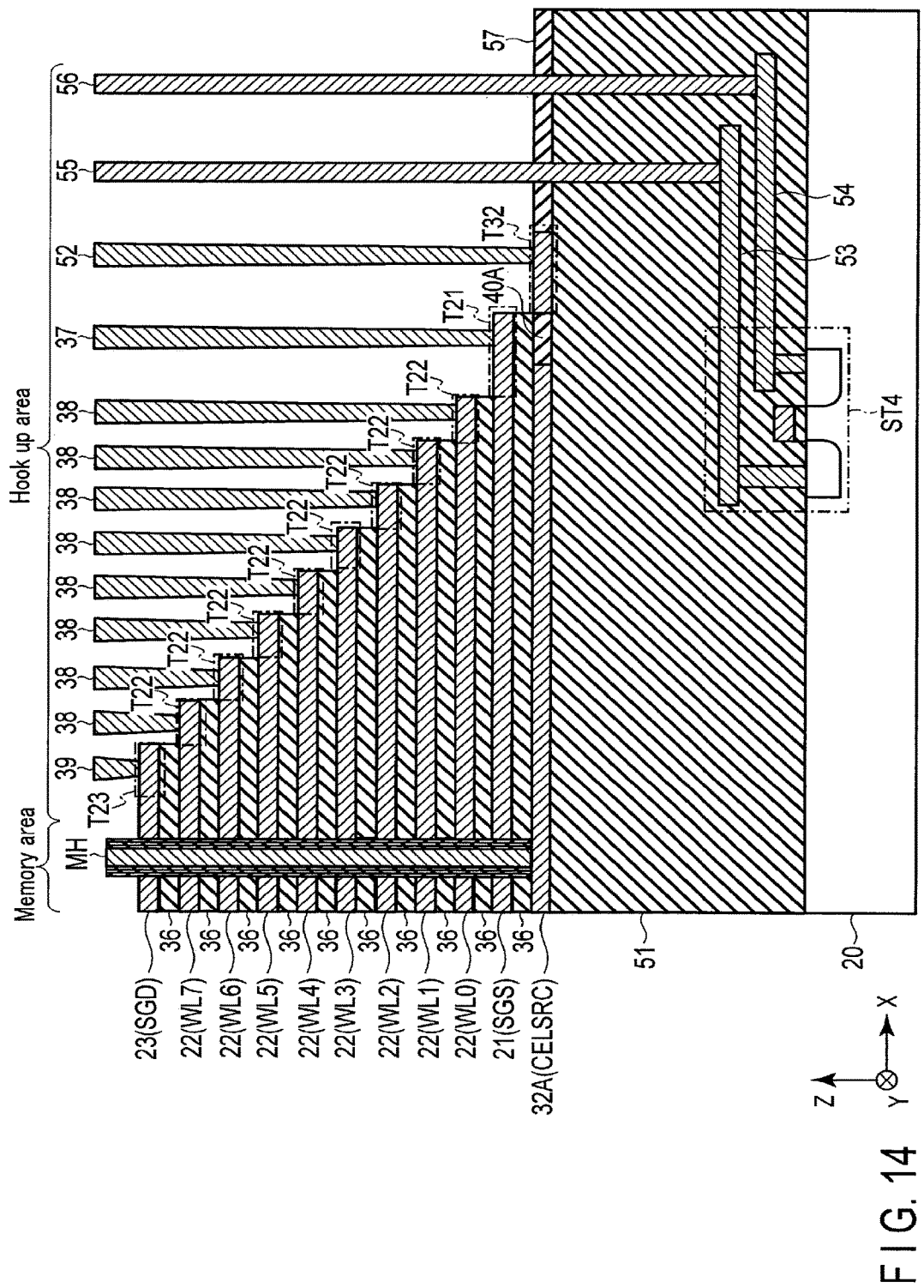
FIG. 14 is a cross-sectional view for explaining the structure of the memory cell array of the semiconductor storage device according to the second embodiment.

The following is a description of a cross-sectional structure of the hookup area according to the second embodiment, with reference to FIG. 14. FIG. 14 is a cross-sectional view taken along line XIV-XIV in FIG. 13, illustrating an example of the hookup area of the memory cell array 10 according to the second embodiment.

As illustrated in FIG. 14, the wiring layers 21 to 23 and 32A, and insulating films 36 extend along the X direction from the memory area, and reach the hookup area. In the hookup area, the wiring layers 21 to 23 and 32A are drawn in a stair shape along the X direction. Namely, the lengths of the respective wiring layers 21 to 23 extending from the memory area side in the X direction are different between the layers, and the length of the lower wiring layer is longer. Specifically, the wiring layer 32A has the longest length extending in the X direction from the memory area side among the wiring layers 21 to 23. Accordingly, the wiring layer 32A includes a terrace region T32 that is not provided with wiring layers 21 to 23 directly above an upper surface thereof. A contact plug 52 is provided on the upper surface of the terrace region T32 of the wiring layer 32A. The contact plug 52 extends in, for example, the Z direction.

The example of FIG. 13 illustrates the case where the wiring layers 21 to 23 and 32A are drawn in a stair shape in a line along the Y direction, but the structure is not limited thereto. Various stair shapes may be applied. For example, the wiring layers 21 to 23 may have a stair shape arranged in two lines along the Y direction, to shorten the wiring length in the X direction.

An insulating region 40A is provided in the wiring layer 32A. The insulating region 40A is provided by embedding an oxide film in a hole extending through the wiring layer 32A in the Z direction, for example. The insulating region 40A includes a region directly under the contact plug 37, in the surface of the wiring layer 32A. More specifically, a region in which a lower end of the contact plug 37 is projected onto the surface of the wiring layer 32A in the Z direction is included in the insulating region 40A.

A transistor ST4, for example, is provided in the semiconductor substrate 20 and the insulating film 51 in a region directly under the wiring layers 21 to 23 and 32A. For example, one end of the transistor ST4 is connected with a wiring layer 53, and the other end thereof is connected with a wiring layer 54. The wiring layers 53 and 54 extend, for example, in the insulating film 51 along the X direction. The wiring layers 53 and 54 are connected with contact plugs 55 and 56, respectively, for example, in a region that is not provided with the wiring layers 21 to 23 and 32A directly above. The contact plugs 55 and 56 extend, for example, in the Z direction.

In the same layer as the wiring layer 32A, an insulating region 57 is provided in the region provided with the contact plugs 55 and 56. The contact plugs 55 and 56 pierce through the insulating region 57 in the Z direction. The insulating regions 40A and 57 are provided together, for example, by the same steps. Accordingly, the oxide films embedded in the insulating regions 40A and 57 are formed of the same material.

2.3 Effect of the Present Embodiment

The semiconductor storage device according to the second embodiment has the structure in which the wiring layer 32A functioning as the source line CELSRC is provided with the insulating region 40A to correspond to the contact plug 37 provided on the wiring layer 21 functioning as the select gate line SGS. The insulating region 40A is configured to include a region obtained by extending the contact plug 37 downward, in the upper surface of the wiring layer 32A. This structure prevents the occurrence of a short circuit between the wiring layer 21 and the wiring layer 32A, even when a manufacturing error occurs in the contact hole's position and depth when the contact hole of the contact plug 37 is provided. A specific example thereof will be described hereinafter with reference to FIG. 15.

FIGS. 15A and 15B illustrate the case where a manufacturing error occurs in the position and the depth in which the contact hole of the contact plug 37 is provided. FIG. 15A is a top view of the insulating region 40A and a region around the insulating region 40A, and FIG. 15B is a cross-sectional view taken along line XV-XV illustrated in FIG. 15A.

As illustrated in FIG. 15A, the contact plug 37 is provided in a position shifted from the contact plug 37e in the case of being provided in an expected predetermined position. However, because the length of each side of the insulating region 40 is sufficiently longer than the diameter of the contact plug 37, the insulating region 40 is disposed directly under the contact plug 37. Accordingly, the insulating region 40 includes the region in which the contact plug 37 is projected onto the surface of the semiconductor substrate in the Z direction.

In addition, as illustrated in FIG. 15B, the contact plug 37 pierces through the wiring layer 21 and the oxide film 36, and reaches to a position deeper than the surface of the wiring layer 32A. However, because the insulating region 40A is provided to fill the hole extending through the wiring layer 32A, the insulating region 40A reaches the surface of the insulating film 51. Accordingly, even when the contact hole pierces through the wiring layer 21, the contact hole does not contact the wiring layer 32A. Therefore, the semiconductor storage device 1 according to the second embodiment prevents the occurrence of a short circuit.

In addition, according to a first mode of the second embodiment, the insulating region 40A is formed of the same material (such as a silicon oxide film) as that of the insulating region 57. This structure enables manufacturing of the insulating region 40A in the same step as that of the insulating region 57.

3. Modification

Embodiments are not limited to the forms described in the first embodiment and the second embodiment described above, but may be variously modified. For example, the insulating region 40 or 40A may include a region in which a plurality of contact plugs 37 is projected onto the semiconductor substrate 20 in the Z direction. Specifically, for example, one insulating region 40 or 40A may be provided for a plurality of contact plugs 37 provided in a plurality of string units SU arranged along the Y direction, or a plurality of blocks BLK arranged along the Y direction. For example, the insulating region 40 or 40A may be provided to extend on the XY plane over the whole hookup area. The shape of the insulating region 40 or 40A is not limited to a rectangular shape, and various shapes may be applied, such as a circular shape and an oval shape.

In addition, for example, in the first embodiment described above, the insulating region 40 bulges with respect to the upper surface of the semiconductor substrate 20. However, the upper surface of the insulating region 40 may be uneven.

A modification of the first embodiment described above will be described with reference to FIGS. 16A and 16B. FIG. 16A is a top view for explaining an insulating region 40B according to a modification of the first embodiment, and FIG. 16B is a cross-sectional view taken along line XVI-XVI in FIG. 16A.

As illustrated in FIG. 16A, an oxide film 58 is embedded in a trench provided in an upper surface of the semiconductor substrate 20 to provide an insulating region 40B. In addition, a recessed portion 58c is formed in part of the region of the oxide film 58 by etching or the like. The bottom portion of the recessed portion 58c is formed to have a depth substantially equal to the upper surface of the semiconductor substrate 20, for example. The recessed portion 58c is provided in a position included in a portion directly under the contact plug 37. In the example of FIG. 16A, the region in which the recessed portion 58c is disposed has, for example, a circular shape, and is included in the region in which the contact plug 37 is disposed, as viewed downward from the Z direction.

As described above, the oxide film 58 bulges with respect to the upper surface of the semiconductor substrate 20. Accordingly, as illustrated in FIG. 16B, the insulating region 40B bulges with respect to the semiconductor substrate 20 in regions between the semiconductor substrate 20 and the recessed portion 58c. By contrast, in the recessed portion 58c, the insulating region 40B is depressed with respect to the surrounding oxide film 58 to substantially the same level as the upper surface of the semiconductor substrate 20. With this structure, in the oxide film 35, regions provided on upper surfaces of the regions between the semiconductor substrate 20 and the recessed portion 58c of the oxide film 58 bulge in the Z direction to be higher than the regions provided on the upper surface of the semiconductor substrate 20. In addition, in the oxide film 35, the region provided on the upper surface of the recessed portion 58c is depressed in the Z direction with respect to the regions provided on upper surfaces of the other regions of the oxide film 58. In the same manner, also in the wiring layer 21, a region provided directly above the recessed portion 58c is depressed in the Z direction with respect to the regions provided directly above the other regions of the oxide film 58. Accordingly, when the upper surface of the wiring layer 21 is viewed along the X direction, the upper surface of the wiring layer 21 bulges at a portion directly above the region between the semiconductor substrate 20 and the recessed portion 58c of the oxide film 58, thereafter is depressed in a portion directly above the recessed portion 58c, and bulges again in a portion directly above the region between the semiconductor substrate 20 and the recessed portion 58c of the oxide film 58. As described above, as viewed downward from the Z direction, the region in which the recessed portion 58c is disposed is included in the region in which the contact plug 37 is disposed. Accordingly, the upper surface of the wiring layer 21 is uneven in the region contacting the lower end of the contact plug 37.

According to the modification of the first embodiment, the upper surface of the insulating region 40B is uneven in a region directly under the contact plug 37. In this manner, the contact plug 37 is provided in an uneven portion in the upper surface of the wiring layer 21. This structure increases the contact area between the contact plug 37 and the wiring layer 21, in comparison with the case where the wiring layer 21 is provided flat, and suppresses contact failure.

In addition, the following matters may be applied in each of the embodiments.

Each memory cell includes a charge accumulation layer disposed on the semiconductor substrate (silicon substrate) via a tunnel insulating film having a thickness of 4 to 10 nm. The charge accumulation layer may be a stacked structure of an insulating film such as SiN or SiON with a thickness of 2 to 3 nm and a polysilicon layer with a thickness of 3 to 8 nm. Metal such as Ru may be added to the polysilicon layer. An insulating film is formed on the charge accumulation layer. The insulating film includes, for example, a silicon oxide film having a thickness of 4 to 10 nm and held between a lower High-k film with a thickness of 3 to 10 nm and an upper High-k film with a thickness of 3 to 10 nm. Examples of the High-k film includes HfO and the like. The thickness of the silicon oxide film may be set thicker than the thickness of the High-k film. A control electrode with a thickness of 30 nm to 70 nm is formed on the insulating film, with a work function adjustment material having a thickness of 3 to 10 nm interposed therebetween. The work function adjustment material is a metal oxide film such as TaO, or a metal nitride film such as TaN. W or the like may be used as the control electrode.

In addition, an air gap may be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A semiconductor storage device comprising:
    a substrate including an insulating region and a semiconductor region;
    a first insulating film which is disposed physically on the insulating region and the semiconductor region;
    a stack body in which conductive layers and insulating layers are alternately stacked, which is disposed physically on the first insulating film, and which includes a first conductive film which is a lowermost layer of the conductive layers, a second insulating film disposed physically on an upper surface of the first conductive film, and a second conductive film disposed physically on an upper surface of the second insulating film;
    a first contact plug in contact with a first terrace region of the first conductive film, the first terrace region being a region on the upper surface of the first conductive film where the second insulating film is not disposed as seen from above the stack body,
    wherein an upper surface of the first insulating film is physically in contact with a lower surface of the first conductive film,
    wherein the first insulating film is thinner than each of the insulating layers of the stack body,
    wherein the upper surface of the insulating region includes an upper surface positioned directly under the first contact plug, and
    a lower surface of the first insulating film is physically in contact with the upper surface of the semiconductor region and the upper surface of the insulating region, in a region directly under the first terrace region.

2. The device of claim 1, further comprising:
    a third conductive film disposed in a layer and separated from the first conductive film in a plane direction of the substrate.

3. The device of claim 1, wherein a lower end of the first contact plug is positioned under the first conductive film.

4. The device of claim 1, wherein
    the second conductive film includes a second terrace region, the second terrace region being a region on the upper surface of the second conductive film where a third insulating film, which is above the second conductive film, is not disposed as seen from above the stack body,
    the first terrace region and the second terrace region are arranged in a first direction, and
    the first terrace region is longer than the second terrace region in the first direction.

5. The device of claim 1, wherein the insulating region bulges with respect to the semiconductor region.

6. The device of claim 1, wherein the upper surface of the insulating region is uneven in a region directly under the first contact plug.

7. The device of claim 1, wherein the insulating region is formed of a same material as a device isolation region disposed in a peripheral circuit portion of the substrate.

8. The device of claim 7, wherein the material comprises a silicon oxide film.

9. The device of claim 1, wherein an upper surface of the first terrace region includes an uneven portion.

10. The device of claim 1, wherein
    the second conductive film and the first terrace region are arranged in a first direction,
    a width of the insulating region in the first direction is substantially three times longer than a width of the first contact plug in the first direction.

11. The device of claim 1, wherein
    the second conductive film and the first terrace region are arranged in a first direction,
    a width of the first terrace region in the first direction is longer than a sum of a width of the insulating region in the first direction and a width between the second conductive film and the insulating region in the first direction.

* * * * *